United States Patent
Ren

(10) Patent No.: US 11,408,921 B2
(45) Date of Patent: Aug. 9, 2022

(54) CIRCUIT AND METHOD FOR REALIZING A COMBINED CONNECTION OF NEUTRAL WIRES OR LIVE WIRES USING PHASE INFORMATION OF THE NEUTRAL WIRES AND THE LIVE WIRES

(71) Applicant: Shanghai Sinceretek Microelectronics Technology Co., Ltd., Shanghai (CN)

(72) Inventor: Xuegang Ren, Shanghai (CN)

(73) Assignee: SHANGHAI SINCERETEK MICROELECTRONICS TECHNOLOGY CO., LTD., Shanghai (CN)

( * ) Notice: Subject to any disclaimer, the term of this patent is extended or adjusted under 35 U.S.C. 154(b) by 128 days.

(21) Appl. No.: 17/013,668

(22) Filed: Sep. 7, 2020

(65) Prior Publication Data

US 2021/0072295 A1      Mar. 11, 2021

(30) Foreign Application Priority Data

Sep. 5, 2019   (CN) .......................... 201910837502.2

(51) Int. Cl.
*G01R 25/00*    (2006.01)
*H02J 3/00*     (2006.01)
*H02M 7/06*     (2006.01)

(52) U.S. Cl.
CPC ................ *G01R 25/00* (2013.01); *H02J 3/00* (2013.01); *H02M 7/06* (2013.01)

(58) Field of Classification Search
CPC ........... G01R 25/00; G01R 31/55; H02J 3/00; H02M 7/06
See application file for complete search history.

(56) References Cited

U.S. PATENT DOCUMENTS

| | | | |
|---|---|---|---|
| 2004/0120356 A1* | 6/2004 | Davenport | H04B 3/54 370/516 |
| 2013/0325376 A1* | 12/2013 | Turicchi, Jr. | H02J 3/26 702/60 |
| 2014/0176336 A1* | 6/2014 | Li | G01R 31/52 340/870.01 |
| 2016/0154040 A1* | 6/2016 | Driscoll | G01D 4/006 324/76.77 |
| 2017/0122991 A1* | 5/2017 | Aki | H02J 13/0006 |

* cited by examiner

Primary Examiner — Dominic E Hawkins
(74) Attorney, Agent, or Firm — Bayramoglu Law Offices LLC

(57) ABSTRACT

A circuit and method for realizing a combined connection of neutral wires or live wires using phase information of the neutral wires and the live wires are provided. The circuit includes a phase detection module. The phase detection module is connected to a power grid via the live wire VL and the neutral wire VN. The phase detection module includes a high-voltage phase detector, a first inverter and a second inverter. The output of the high-voltage phase detector is sequentially connected to the first inverter and the second inverter. The method includes: arranging nodes on the live wire VL and the neutral wire VN of the power grid, respectively; defining the nodes by determining a phase relationship that a high-voltage signal first appears on the live wire VL or the neutral wire VN; and connecting systems to be connected in parallel to the power grid through the nodes.

9 Claims, 3 Drawing Sheets

CIRCUIT AND METHOD FOR REALIZING A COMBINED CONNECTION OF NEUTRAL WIRES OR LIVE WIRES USING PHASE INFORMATION OF THE NEUTRAL WIRES AND THE LIVE WIRES

CROSS REFERENCE TO THE RELATED APPLICATIONS

This application is based upon and claims priority to Chinese Patent Application No. 201910837502.2, filed on Sep. 5, 2019, the entire contents of which are incorporated herein by reference.

TECHNICAL FIELD

The present invention belongs to the field of circuits, and more particularly, relates to a circuit and method for realizing a combined connection of neutral wires or live wires using phase information of the neutral wires and the live wires.

BACKGROUND

In typical alternating current (AC) power supply systems, the neutral wire VN and the live wire VL in the AC power grid are output after passing through a full-phase rectifier bridge. The rectifier bridge has a high voltage at the positive output terminal and a low voltage at the negative output terminal. In a majority of applications, it is unnecessary to distinguish between the neutral wire VN and the live wire VL. Two systems that are both supplied by AC power supply are independent of each other when connected to a power grid in parallel.

In some special applications, however, when two or more systems are connected to the AC grid simultaneously, it is necessary to distinguish between the neutral wire and the live wire. In emergency lighting applications, for example, the internal power supply of the system outputs an electric current from one of the input terminals in order to detect the grid impedance. This electric current returns to another input terminal through the AC grid. In this case, it is critical to distinguish between the neutral wire VN and the live wire VL of the system. Otherwise, if the neutral wire VN and the live wire VL of the above-mentioned two systems are in a combined connection, the grid impedance may be erroneously detected by the system, that is, the electric current flowing from one of the systems will pass through the other system, causing one of the systems to malfunction.

Currently, the practice is to use two power cords of different colors to distinguish the neutral wire VN and the live wire VL before a system leaves the factory, which will be clearly described in the product manual for specific applications. After two systems are connected to the power grid in parallel, it is necessary to correctly distinguish between the neutral wire VN and the live wire VL. This presents additional steps or requirements for the product application and wiring construction. Moreover, in a system with complicated wiring, unreasonable AC wiring may appear. At this time, the two systems cannot be used in parallel in such products.

FIG. 1 and FIG. 2 schematically show two identical systems that need to distinguish the neutral wire and the live wire, which illustrate that the neutral wire VN and the live wire VL of the system have different internal circuits. For each individual system, electric current flows from the live wire into the neutral wire. If the neutral wires and live wires of the two systems are in a combined connection, electric current may flow from the live wire of one of the systems into the neutral wire of the other system, causing malfunction of the system.

FIG. 3 schematically shows a correct wiring method of the above-mentioned systems where the neutral wire and the live wire need to be distinguished from each other.

FIG. 4 schematically shows an improper wiring method of the above-mentioned systems where the neutral wire and the live wire need to be distinguished from each other.

SUMMARY

In view of the above-mentioned issues, the present invention provides a circuit and method for realizing a combined connection of neutral wires or live wires using phase information of the neutral wires and the live wires. The first objective of the present invention is to provide the circuit with nodes arranged on the live wire VL and the neutral wire VN, and determining, by a high-voltage phase detector, a node where a high-voltage signal appears first on the live wire VL and the neutral wire VN when a switch is closed. The second objective of the present invention is to provide the method capable of connecting two systems connected to the AC grid in parallel based on the nodes being distinguished. The neutral wire of one of the systems is connected to the neutral wire of the other system, and the live wire of one of the systems is connected to the live wire of the other system.

To achieve the above-mentioned objectives, the present invention adopts the following technical solutions.

A circuit for realizing a combined connection of neutral wires or live wires using phase information of the neutral wires and the live wires, includes: a phase detection module. The phase detection module is connected to a power grid via the live wire VL and the neutral wire VN. The phase detection module includes a high-voltage phase detector, a first inverter and a second inverter. The output of the high-voltage phase detector is sequentially connected to the first inverter and the second inverter. A plurality of nodes are arranged on each of the live wire VL and the neutral wire VN. The output of the first inverter is connected to a node on the live wire VL and a node on the neutral wire VN, respectively. The output of the second inverter is connected to another node on the live wire VL and another node on the neutral wire VN, respectively.

In this technical solution, the nodes are arranged on the live wire VL and the neutral wire VN, and the high-voltage phase detector determines a node where a high-voltage signal appears first on the live wire VL and the neutral wire VN when a switch is closed.

Preferably, the number of nodes on the live wire VL connected to the output of the first inverter is equal to the number of nodes on the neutral wire VN connected to the output of the first inverter, which is at least one. The number of nodes on the live wire VL connected to the output of the second inverter is equal to the number of nodes on the neutral wire VN connected to the output of the second inverter, which is at least one. The output of the first inverter and the output of the second inverter will not be connected to the same node.

Preferably, the circuit further includes a rectifier bridge BR. The two AC input terminals of the rectifier bridge BR are connected to the live wire VL and the neutral wire VN of the power grid, respectively. The positive output terminal of the rectifier bridge BR is connected to a VBUS interface, and the negative output terminal of the rectifier bridge BR is grounded. The VBUS interface is connected to a capacitor C1.

Preferably, the phase of an output signal of the first inverter is opposite to the phase of an output signal of the second inverter.

Preferably, the high-voltage phase detector outputs a high level when detecting that a high-voltage signal first appears on the live wire VL.

Preferably, the high-voltage phase detector outputs a low level when detecting that a high-voltage signal first appears on the neutral wire VN.

A method for realizing a combined connection of neutral wires or live wires using phase information of the neutral wires and the live wires, includes: arranging nodes on the live wire VL and the neutral wire VN of the power grid, respectively; defining the nodes by determining a phase relationship that a high-voltage signal first appears on the live wire VL or the neutral wire VN; and connecting a system in parallel to the power grid through the nodes.

Preferably, the number of nodes on the live wire VL is equal to the number of nodes on the neutral wire VN.

Preferably, the method further includes: determining all nodes on the live wire VL and the neutral wire VN where the high-voltage signal appears first and all nodes on the live wire VL and the neutral wire VN where the high-voltage signal appears later, and connecting the system in parallel to the nodes on the live wire VL and the neutral wire VN.

More preferably, the system to be connected in parallel is connected across the node where the high-voltage signal appears first and the node where the high-voltage signal appears later.

Compared with the prior art, the present invention has the following advantages.

1. The circuit and method for realizing a combined connection of neutral wires or live wires using phase information of the neutral wires and the live wires are capable of distinguishing the neutral wire and the live wire of the system, whereby the systems are automatically adjusted so that all the neutral wires of the systems connected in parallel to the grid are connected together, and all the live wires of the systems are connected together. This avoids the process for distinguishing the neutral wires and the live wires of the systems used in parallel.

2. The circuit and method for realizing the combined connection of the neutral wires or the live wires using the phase information of the neutral wires and the live wires additionally has a phase detection function and thus can realize the combined connection of the neutral wires and the live wires, which improves the product performance, simplifies the circuit, and reduces the cost of the system scheme.

In the figures: 1, first node; 2, second node; 3, third node; 4, fourth node; 5, high-voltage phase detector; 6, first inverter; 7, second inverter.

DETAILED DESCRIPTION OF THE EMBODIMENTS

In order to better understand the present invention, the content of the present invention will be further clarified hereinafter with reference to the drawings and embodiments, but the present invention is not limited to the following embodiments.

Embodiment

In the description of the present invention, it should be understood that the terminologies "first", "second" and the like in the description and claims of the present invention and the above-mentioned drawings are used to distinguish similar objects rather than to necessarily describe a specific order or sequence. It should be understood that the data used in this way can be interchanged under appropriate circumstances to facilitate describing the embodiments of the present invention herein. It should be understood that the embodiment is illustrated using nodes where a high-voltage signal first appears as an example but is not limited thereto, it can also be, for example, nodes where a high-voltage signal last appears. In addition, the terminologies "include", "have" and any variations of them are intended to cover a non-exclusive inclusion. For example, a process, method, system, product or device that includes a series of steps or units is not necessarily limited to those clearly listed steps or units, but may include other steps or units that are not clearly listed or are inherent to the process, method, product or device.

A method for realizing a combined connection of neutral wires or live wires using phase information of the neutral wires and the live wires is provided. The nodes are arranged on the live wire VL and the neutral wire VN of the power grid, respectively, wherein the number of nodes on the live wire VL is equal to the number of nodes on the neutral wire VN. The nodes are defined by determining a phase relationship that the high-voltage signal first appears on the live wire VL or the neutral wire VN. The systems are connected in parallel to the power grid through the nodes.

All nodes on the live wire VL and the neutral wire VN where the high-voltage signal appears first and all nodes on the live wire VL and the neutral wire VN where the high-voltage signal appears later are determined, and the systems are connected in parallel across the nodes where the high-voltage signal appears first and the nodes where the high-voltage signal appears later.

Figure 1:
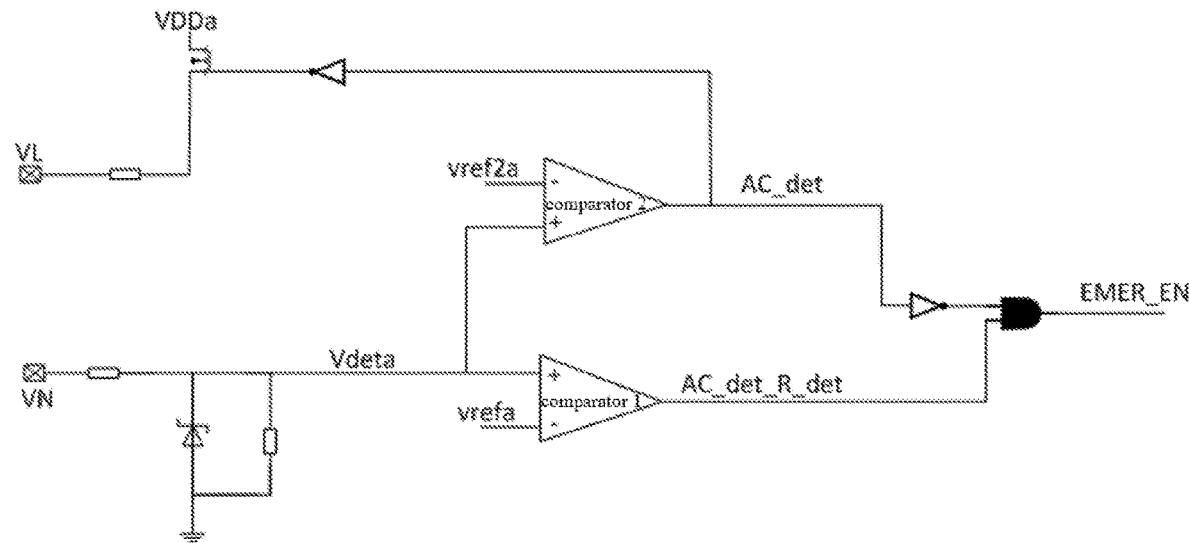
FIG. 1 is one of two identical systems of the prior art.
Figure 2:
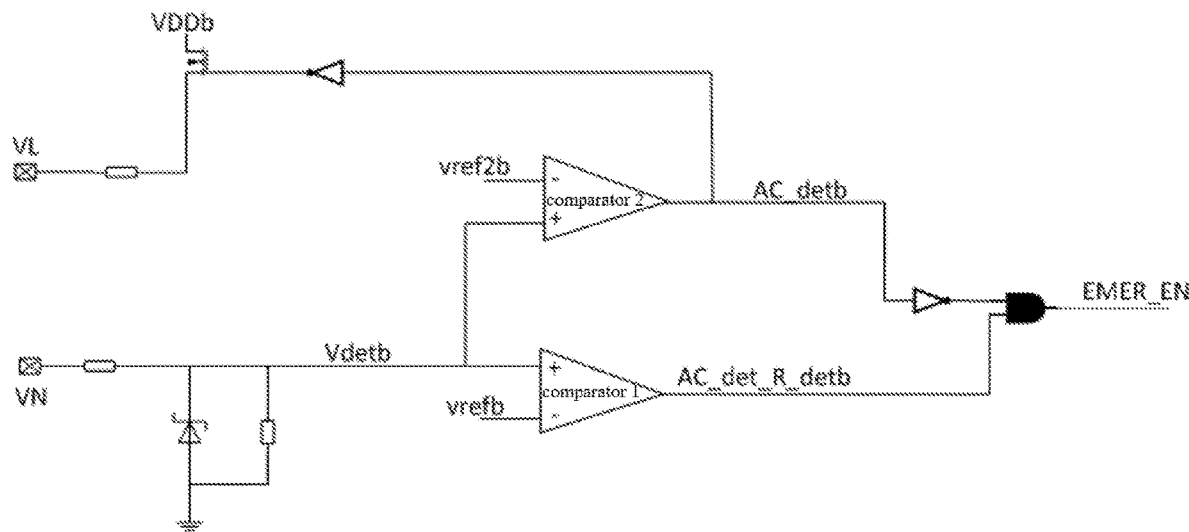
FIG. 2 is the other system of the two identical systems of the prior art.
Figure 3:
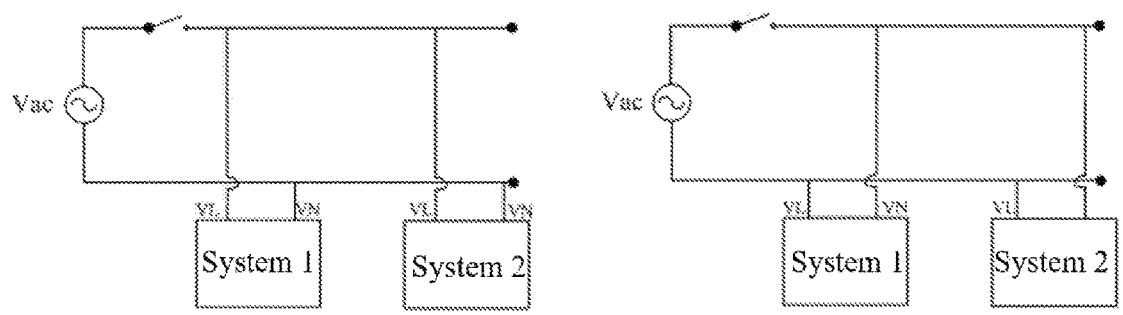
FIG. 3 schematically shows a correct wiring method of systems that need to distinguish the neutral wires and the live wires of the prior art.
Figure 4:
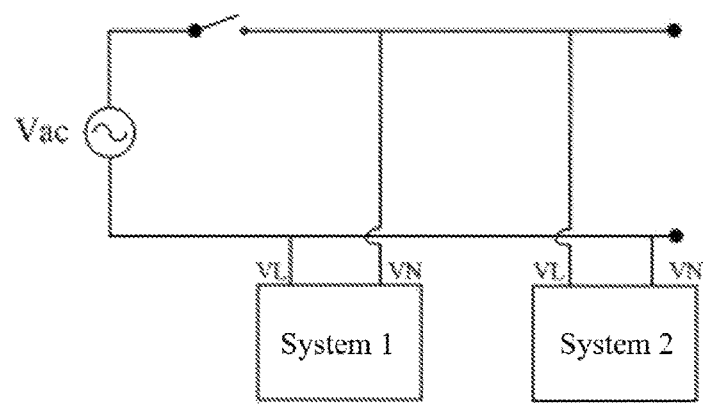
FIG. 4 schematically shows an improper wiring method of the systems that need to distinguish the neutral wires and the live wires of the prior art.
Figure 5:
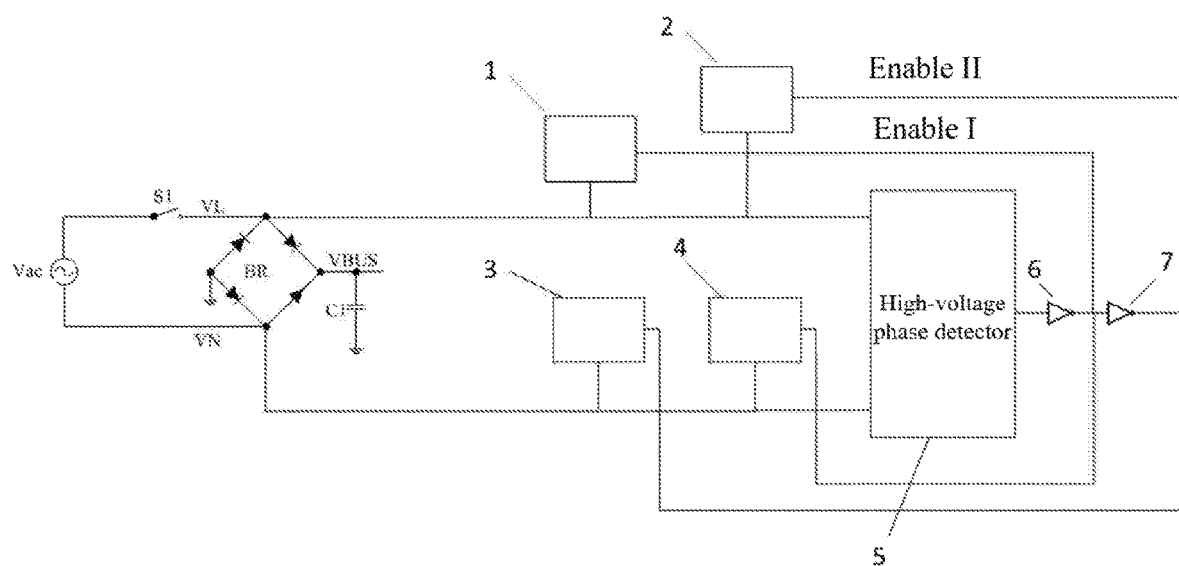
FIG. 5 is a schematic diagram of the circuit for realizing a combined connection of neutral wires or live wires using phase information of the neutral wires and the live wires according to the present invention.

As shown in FIG. 5, a circuit for realizing a combined connection of neutral wires or live wires using phase information of the neutral wires and the live wires, includes: a phase detection module. The phase detection module is connected to the power grid via the live wire VL and the neutral wire VN. The phase detection module includes the high-voltage phase detector 5, the first inverter 6 and the second inverter 7. The output of the high-voltage phase detector 5 is sequentially connected to the first inverter 6 and the second inverter 7. The phase of the output signal of the first inverter 6 is opposite to the phase of the output signal of the second inverter 7.

The high-voltage phase detector 5 is configured to determine the phase relationship where a high-voltage signal first appears. When detecting that the high-voltage signal first appears on the live wire VL, the high-voltage phase detector 5 outputs a high level. At this time, the function of the live wire VL is defined as function I, and the function of the neutral wire VN is defined as function II. When detecting that the high-voltage signal first appears on the neutral wire VN, the high-voltage phase detector 5 outputs a low level. At this time, the function of the live wire VL is defined as function II, and the function of the neutral wire VN is defined as function I.

The output of the first inverter 6 is connected to a node on the live wire VL and a node on the neutral wire VN, respectively, wherein the number of nodes on the live wire VL connected to the output of the first inverter is equal to the number of nodes on the neutral wire VN connected to the output of the first inverter and is at least one. The output of the second inverter 7 is connected to another node on the live wire VL and another node on the neutral wire VN, respectively, wherein the number of nodes on the live wire VL connected to the output of the second inverter is equal to the number of nodes on the neutral wire VN connected to the output of the second inverter and is at least one. In the present embodiment, two nodes, including the first node 1 and the second node 2, are arranged on the live wire VL. Also, two nodes, including the third node 3 and the fourth node 4, are arranged on the neutral wire VN. The first node 1 on the live wire VL and the fourth node 4 on the neutral wire VN are connected to the output of the first inverter 6. The second node 2 on the live wire VL and the third node 3 on the neutral wire VN are connected to the output of the second inverter 7. The first node 1 and the second node 2 on the live wire VL and the third node 3 and the fourth node 4 on the neutral wire VN are configured to connect circuit systems in parallel to implement the specific functions of the live wire VL and the neutral wire VN.

The circuit further includes the rectifier bridge BR. The two AC input terminals of the rectifier bridge BR are connected to the live wire VL and the neutral wire VN of the power grid, respectively. The positive output terminal of the rectifier bridge BR is connected to a VBUS interface, and the negative output terminal of the rectifier bridge BR is grounded. The VBUS interface is connected to the capacitor C1.

The working principle of the circuit for realizing the combined connection of the neutral wires or the live wires using the phase information of the neutral wires and the live wires according to the present invention is as follows:

When the switch S1 is in the cut-off state, neither the live wire VL nor the neutral wire VN has an AC input signal. When the switch S1 is closed at the time T1, the input AC signal has a phase difference of the input high voltage between the live wire VL and the neutral wire VN.

Figure 6:
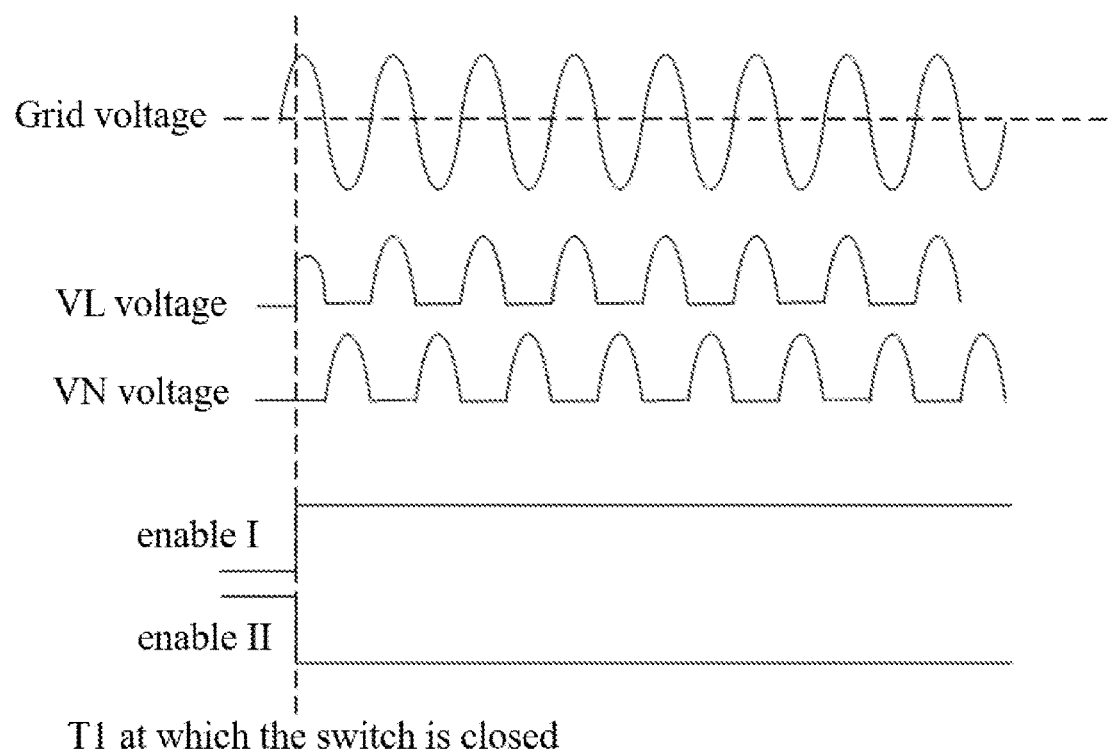
FIG. 6 is a schematic diagram showing signals of VL and VN of the circuit for realizing the combined connection of the neutral wires or the live wires using the phase information of the neutral wires and the live wires according to the present invention.

As shown in FIG. 6 (the negative output terminal of the rectifier bridge BR is used as a reference), the grid voltage, the live wire VL and the neutral wire VN output AC signals. Assuming that the switch is closed at T1, then the grid voltage and the voltage of the live wire VL are at the maximum peak, and the neutral wire VN has no voltage output. Then enable I outputs a high level, enable II outputs a low level, and the high-voltage phase detector 5 detects that the input high-voltage signal first appears at the signal terminal of the live wire VL. Thus, the output of the phase detection module is a high level. Since the live wire VL has a peak voltage signal at T1, the function of the live wire VL in this case is defined as function I. Since the neutral wire VN has no voltage output at T1, the function of the neutral wire VN in this case is defined as function II.

Figure 7:
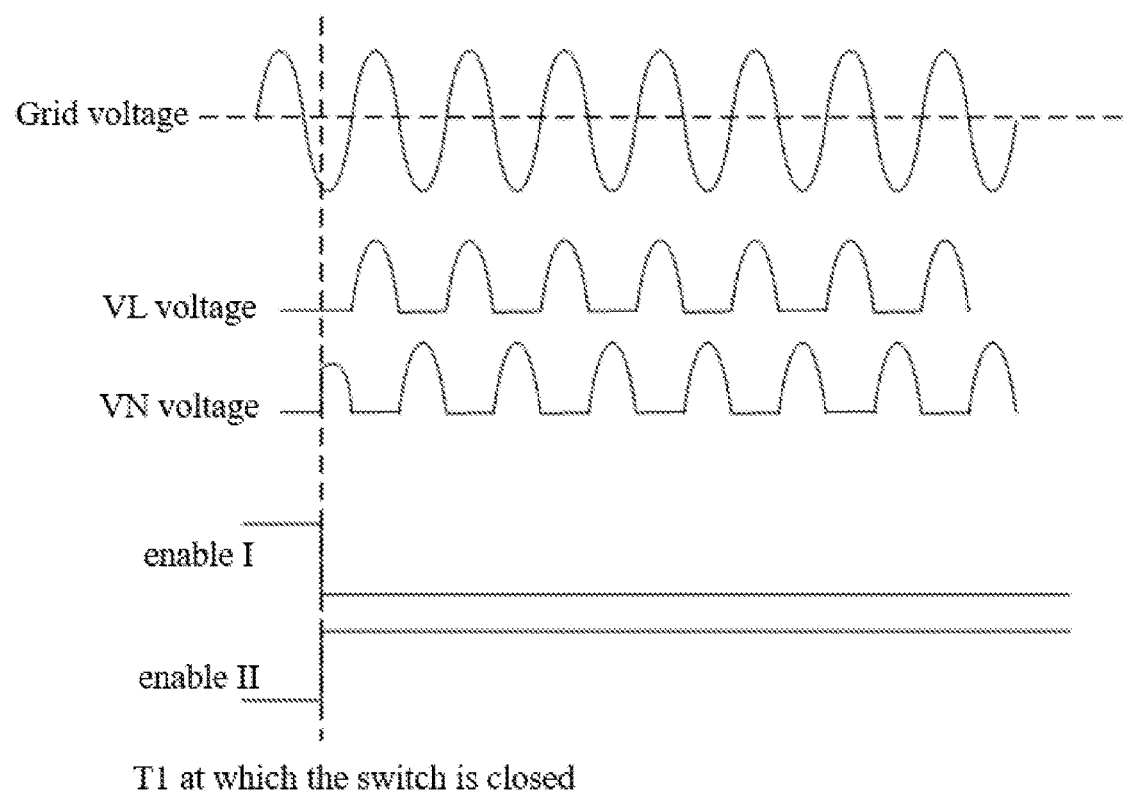
FIG. 7 is another schematic diagram showing signals of VL and VN of the circuit for realizing the combined connection of the neutral wires or the live wires using the phase information of the neutral wires and the live wires according to the present invention.

As shown in FIG. 7, the grid voltage, the live wire VL and the neutral wire VN output AC signals. Assuming that the switch is closed at T1, then the grid voltage is at the minimum valley, the live wire VL has no voltage output, and the neutral wire VN has a peak voltage. Thus, enable I outputs a low level, enable II outputs a high level, and the high-voltage phase detector 5 detects that the input high-voltage signal first appears at the signal terminal of the neutral wire VN. Thus, the output of the phase detection module is a low level. Since the live wire VL has no voltage output at T1, the function of the live wire VL in this case is defined as function II. Since the neutral wire VN has a peak voltage signal at T1, the function of the neutral wire VN in this case is defined as function I.

The first system to be connected in parallel is connected to the first node 1 and the fourth node 4, and the second system to be connected in parallel is connected to the second node 2 and the third node 3. After the switch of the power grid is closed, the input AC signals of the systems are at the same node. The node where the AC signal appears first is set as a node of function I, and the node where the AC signal appears later is set as a node of function II. For example, the first system defines the first node 1 as the node of function I and defines the fourth node 4 as the node of function II, and the second system defines the third node 3 as the node of function I and defines the second node 2 as the node of function II. Since the switch is closed, for all systems connected to the switch, the high-voltage signals appearing first are at the same node. According to the above logic, all systems define the nodes where the high-voltage signals appear first as the nodes of function I. In this way, even if two systems connected in parallel have a combined connection of neutral and live wires, the systems will uniformly define the nodes of function I as the same node and define the nodes of function II as the same node to ensure the normal use of the systems after the combined connection.

Although the embodiments of the present invention have been shown and described, those having ordinary skills in the art can understand that various changes, modifications, substitutions, and variations can be made to these embodiments without departing from the principle and spirit of the present invention, and the scope of the present invention is defined by the appended claims and equivalents thereof

What is claimed is:

1. A circuit for realizing a combined connection of neutral wires or live wires using phase information of the neutral wires and the live wires, comprising:
   a phase detection module; wherein
   the phase detection module is connected to a power grid via the live wires and the neutral wires;
   the phase detection module comprises a high-voltage phase detector, a first inverter and a second inverter;
   an output of the high-voltage phase detector is sequentially connected to the first inverter and the second inverter;
   a plurality of nodes are arranged on each live wire of the live wires and a plurality of nodes are arranged on each neutral wire of the neutral wires;

an output of the first inverter is connected to a first node of the plurality of nodes on the each live wire and a first node of the plurality of nodes on the each neutral wire, respectively; and an output of the second inverter is connected to a second node of the plurality of nodes on the each live wire and a second node of the plurality of nodes on the each neutral wire, respectively.

2. The circuit according to claim 1, wherein,
a number of the first node on the each live wire is equal to a number of the first node on the each neutral wire and the number of the first node is at least one; a number of the second node on the each live wire is equal to a number of the second node on the each neutral wire and the number of the second node is at least one; and
the output of the first inverter and the output of the second inverter are not connected to one node of the plurality of nodes on the each live wire, and the output of the first inverter and the output of the second inverter are not connected to one node of the plurality of nodes on the each neutral wire.

3. The circuit according to claim 1, further comprising a rectifier bridge; wherein
two AC input terminals of the rectifier bridge are connected to the live wires and the neutral wires of the power grid, respectively;
a positive output terminal of the rectifier bridge is connected to a VBUS interface, and a negative output terminal of the rectifier bridge is grounded; and
the VBUS interface is connected to a capacitor.

4. The circuit according to claim 1, wherein,
a phase of an output signal of the first inverter is opposite to a phase of an output signal of the second inverter.

5. The circuit according to claim 1, wherein,
the high-voltage phase detector outputs a high level when detecting that a high-voltage signal first appears on the live wires.

6. The circuit according to claim 1, wherein,
the high-voltage phase detector outputs a low level when detecting that a high-voltage signal first appears on the neutral wires.

7. A method for realizing a combined connection of neutral wires or live wires using phase information of the neutral wires and the live wires, comprising:
arranging a plurality of nodes on each live wire of the live wires of a power grid, and arranging a plurality of nodes on each neutral wire of the neutral wires of the power grid;
defining the plurality of nodes on the each live wire and the plurality of nodes on the each neutral wire by determining a phase relationship that a high-voltage signal first appears on the live wires or the neutral wires;
connecting systems to be connected in parallel to the power grid through the plurality of nodes on the each live wire and the plurality of nodes on the each neutral wire;
determining first nodes of the plurality of nodes on the live wire and the plurality of nodes on the neutral wire, wherein the high-voltage signal appears on the first nodes at a first time, and determining second nodes of the plurality of nodes on the live wire and the plurality of nodes on the neutral wire, wherein the high-voltage signal appears on the second nodes at a second time, and the first time is prior to the second time; and
connecting the systems to be connected in parallel to the first nodes and the second nodes.

8. The method according to claim 7, wherein,
a number of the plurality of nodes on the each live wire is equal to a number of the plurality of nodes on the each neutral wire.

9. The method according to claim 7, wherein,
the systems to be connected in parallel are connected across each of the first nodes and each of the second nodes.

* * * * *